US012610555B2

(12) United States Patent
Worledge et al.

(10) Patent No.: US 12,610,555 B2
(45) Date of Patent: Apr. 21, 2026

(54) MULTILAYERED MAGNETIC FREE LAYER STRUCTURE FOR SPIN-TRANSFER TORQUE (STT) MRAM

(71) Applicant: International Business Machines Corporation, Armonk, NY (US)

(72) Inventors: Daniel Worledge, San Jose, CA (US); Guohan Hu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 17/562,662

(22) Filed: Dec. 27, 2021

(65) Prior Publication Data

US 2022/0123049 A1 Apr. 21, 2022

Related U.S. Application Data

(63) Continuation of application No. 16/184,551, filed on Nov. 8, 2018, now abandoned.

(51) Int. Cl.
| | |
|---|---|
| *H10B 61/00* | (2023.01) |
| *H10N 50/01* | (2023.01) |
| *H10N 50/10* | (2023.01) |
| *H10N 50/80* | (2023.01) |

(52) U.S. Cl.
CPC ............ *H10B 61/00* (2023.02); *H10N 50/01* (2023.02); *H10N 50/10* (2023.02); *H10N 50/80* (2023.02)

(58) Field of Classification Search
None
See application file for complete search history.

(56) References Cited

U.S. PATENT DOCUMENTS

| | | | |
|---|---|---|---|
| 7,531,830 | B2 | 5/2009 | Kaiser et al. |
| 7,834,410 | B2 | 11/2010 | Wang et al. |
| 8,184,411 | B2 | 5/2012 | Zhang et al. |
| 8,710,603 | B2 | 4/2014 | Jan et al. |

(Continued)

OTHER PUBLICATIONS

Freescale Semiconductor, Inc., "Magnetoreistive Random Access Memory", Jun. 23, 2006, https://www.nxp.com/files-static/memory/doc/white_paper/MRAMWP.pdf (Year: 2006).*

(Continued)

*Primary Examiner* — Vincent Wall
(74) *Attorney, Agent, or Firm* — Scully, Scott, Murphy & Presser, P.C.; Yuanmin Cai

(57) ABSTRACT

A multilayered magnetic free layer structure is provided that includes a first magnetic free layer and a second magnetic free layer separated by a non-magnetic layer in which the second magnetic free layer has a lower perpendicular magnetic anisotropy field, $H_k$, as compared with the first magnetic free layer. The multilayered magnetic free layer structure of the present application substantially reduces the switching current needed to reorient the magnetization of the two magnetic free layers. The lower $H_k$ value of the second magnetic free layer as compared to the first magnetic free layer improves the switching speed of the second magnetic free layer and thus reduces, and even eliminates, write errors.

12 Claims, 2 Drawing Sheets

(56) References Cited

U.S. PATENT DOCUMENTS

| | | | |
|---|---|---|---|
| 8,946,834 B2 | 2/2015 | Wang et al. | |
| 2013/0230741 A1 | 9/2013 | Wang et al. | |
| 2014/0145792 A1 | 5/2014 | Wang et al. | |
| 2015/0001656 A1 | 1/2015 | Beach et al. | |
| 2015/0129993 A1* | 5/2015 | Tang .................... | G11C 11/161 |
| | | | 257/421 |
| 2015/0129997 A1 | 5/2015 | Tang et al. | |

OTHER PUBLICATIONS

Tudu et al., Effect of Composition and Thickness of the Perpendicular Magnetic Anisotropy of (Co/Pd) Mulitlayers, Sensors, v.17, 2743, Dec. 2017, Nov. 28, 2017, doi: 10.3390/s17122743 (Year: 2017).*

Applicant's admitted prior art shown in Applicant's figure 2. (Year: 2018).*

Sun, J.Z., et al., "Spin-current interaction with a monodomain magnetic body: A model study", Physical Review B, Jul. 1, 2000, pp. 570-578, vol. 62, No. 1.

Khvalkovskiy et al., "Basic principles of STT-MRAM cell operation in memory arrays", Journal of Physics D Applied Physics, Jan. 2013, pp. 1-35, DOI:10.1088/0022-3727/46/074001.

Tudu et al., "Effect of Composition and Thickness on the Perpendicular Magnetic Anisotropy of (Co/Pd) Multilayers", Sensors, v.17, 2743, Dec. 2017; Published online Nov. 2, 20178. doi: 10.3390/s17122743.

Yoshida et al.: Enhanced Thermal Stability in Perpendicular Top-Pinned Magnetic Tunnel Junction, IEEE Transactions on Magnetics, vol. 49, No. 7, Jul. 2013.

Mizukami et al., Mn-based hard magnets with small saturation magnetization and low spin relaxation for spintronics, Scripta Materialia 118 (2016) 70-74.

List of IBM Patents or Patent Applications Treated as Related dated Dec. 27, 2021, 2 pages.

* cited by examiner

MULTILAYERED MAGNETIC FREE LAYER STRUCTURE FOR SPIN-TRANSFER TORQUE (STT) MRAM

BACKGROUND

The present application relates to magnetoresistive random access memory (MRAM).

More particularly, the present application relates to a magnetic tunnel junction (MTJ) pillar including a multilayered magnetic free layer structure that can improve the performance of spin-transfer torque (STT) MRAM.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier). One of the two plates (i.e., the magnetic reference or pinned layer) is a permanent magnetic set to a particular polarity; the other plate's (i.e., the magnetic free layer's) magnetization can be changed to store information. Such elements may be referred to as a magnetic tunnel junction (MTJ) pillar.

One type of MRAM that can use such a MTJ pillar is STT MRAM. STT MRAM has the advantages of lower power consumption and better scalability over conventional magnetoresistive random access memory which uses magnetic fields to flip the active elements. In STT MRAM, spin-transfer torque is used to flip (switch) the orientation of the magnetic free layer. Moreover, spin-transfer torque technology has the potential to make possible MRAM devices combining low current requirements and reduced cost; however, the amount of current needed to reorient (i.e., switch) the magnetization is at present too high for most commercial applications.

In the prior art of spin torque switching, the emphasis has been on lowering the magnetic damping (also called Gilbert damping) of the magnetic free layer. The theory suggests that the switching current is directly proportional to the damping; see, for example, J. Z. Sun, Phys. Rev. B 62, 570 (2000). Hence, lower damping makes the free layer switch in lower current, which is desirable since it means a smaller cell transistor can be used.

In the prior art of spin torque switching, the emphasis has also been to increase the perpendicular magnetic anisotropy field, $H_k$, of the magnetic material of each magnetic free layer in order to allow the reduction of the moment of the free layer to enable fast switching while maintaining high activation energy, which provides good data retention. In the single domain model, the activation energy, Eb, is proportional to the product of the anisotropy field and the free layer magnetic moment, m, as in $Eb=\frac{1}{2}mH_k$. Reducing m reduces the number of spins in the free layer and therefore, due to conservation of angular momentum, reduces the time required to switch. Therefore, in order to maintain the required Eb, the prior art requires increasing $H_k$. The magnetic anisotropy field, $H_k$, is the perpendicular field required to saturate a perpendicularly magnetized layer in the perpendicular-direction, as is shown schematically in FIG. 1.

FIG. 2 illustrates a prior art MTJ pillar that has been developed in order to reduce the current needed to reorient (i.e., switch) the magnetization of the active elements. The prior art MTJ pillar of FIG. 2 includes a multilayered magnetic free layer structure 14 that contains two magnetic free layers (16 and 20) separated by a non-magnetic layer 18. The prior art MTJ pillar of FIG. 2 also includes a magnetic reference (or pinned) layer 10, and a tunnel barrier layer 12. Element 16 is the first magnetic free layer that forms an interface with the tunnel barrier layer 12, while element 20 is the second magnetic free layer that is separated from the first magnetic free layer 16 by the non-magnetic layer 18. In the drawing, the arrow within the magnetic reference layer 10 shows a possible orientation of that layer and the double headed arrows in the first and second magnetic free layers (16 and 20) illustrate that the orientation in those layers can be switched. The non-magnetic layer 28 is thin enough that the two magnetic free layers (16 and 20) are coupled together magnetically, so that in equilibrium the first and second magnetic free layers 16 and 20 are always parallel. In the prior art, the first and second magnetic free layers (16, 20) typically have a perpendicular magnetic anisotropy of 3000 Oe or greater.

One drawback of the prior art MTJ pillar shown in FIG. 2 is that the switching of the multilayered magnetic free layer structure 14 can be too slow in comparison to the length of the applied voltage pulse. This 'drag' in switching of the orientation of the multilayered magnetic free layer structure 14 of the prior art MTJ pillar of FIG. 2 may result in a write error.

There is thus a need for providing MTJ pillars for use in STT MRAM technology which include an improved multilayered magnetic free layer structure that substantially reduces the switching current needed to reorient the magnetization of the multilayered magnetic free layer, while improving the switching speed and even reducing write errors of the STT MRAM.

SUMMARY

A multilayered magnetic free layer pillar is provided that includes a first magnetic free layer and a second magnetic free layer separated by a non-magnetic layer in which the second magnetic free layer has a lower perpendicular magnetic anisotropy field, $H_k$, as compared with the first magnetic free layer. The multilayered magnetic free layer structure of the present application substantially reduces the switching current needed to reorient the magnetization of the two magnetic free layers. The lower $H_k$ value of the second magnetic free layer as compared to the first magnetic free layer improves the switching speed of the second magnetic free layer and thus reduces, and even eliminates, write errors.

In one aspect of the present application, a magnetic tunnel junction (MTJ) pillar is provided. In one embodiment, the MTJ pillar includes a multilayered magnetic free layer structure including a first magnetic free layer having a first perpendicular magnetic anisotropy field and a second magnetic free layer having a second perpendicular magnetic anisotropy field separated by a non-magnetic layer. In accordance with the present application, the second perpendicular magnetic anisotropy field is lower than the first perpendicular magnetic anisotropy field.

In another aspect of the present application, a spin-transfer torque magnetic random access memory (STT MRAM) is provided. In one embodiment, the STT MRAM includes a magnetic tunnel junction pillar including a multilayered magnetic free layer structure of a first magnetic free layer having a first perpendicular magnetic anisotropy field and a second magnetic free layer having a second first perpendicular magnetic anisotropy field separated by a non-magnetic layer. In accordance with the present application, the second perpendicular magnetic anisotropy field is less than the first perpendicular magnetic anisotropy field.

In yet another aspect of the present application, a method of improving the performance of a spin-transfer torque magnetic random access memory (STT MRAM) is provided. In one embodiment, the method providing a multilayered magnetic free layer structure on a surface of a tunnel barrier that is located on a magnetic reference layer. The multilayered magnetic free layer structure includes a first magnetic free layer having a first perpendicular magnetic anisotropy field and a second magnetic free layer having a second first perpendicular magnetic anisotropy field separated by a non-magnetic layer. In accordance with the present application, the second perpendicular magnetic anisotropy field is less than the first perpendicular magnetic anisotropy field.

DETAILED DESCRIPTION

Figure 1:
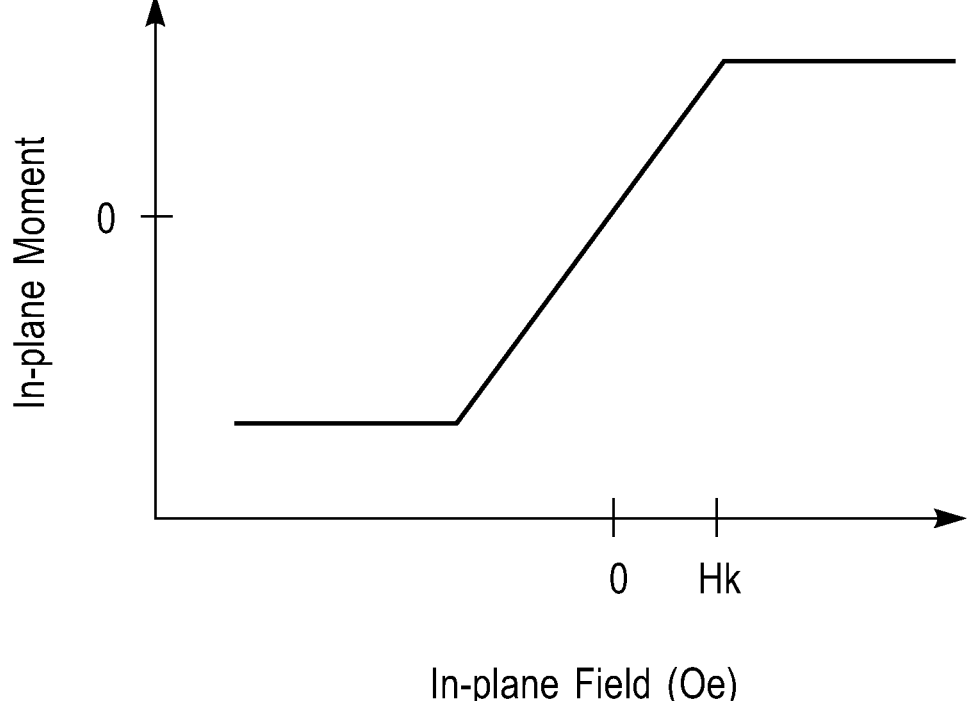
FIG. 1 is a graph of perpendicular moment vs. perpendicular field for a typically MTJ pillar.
Figure 2:
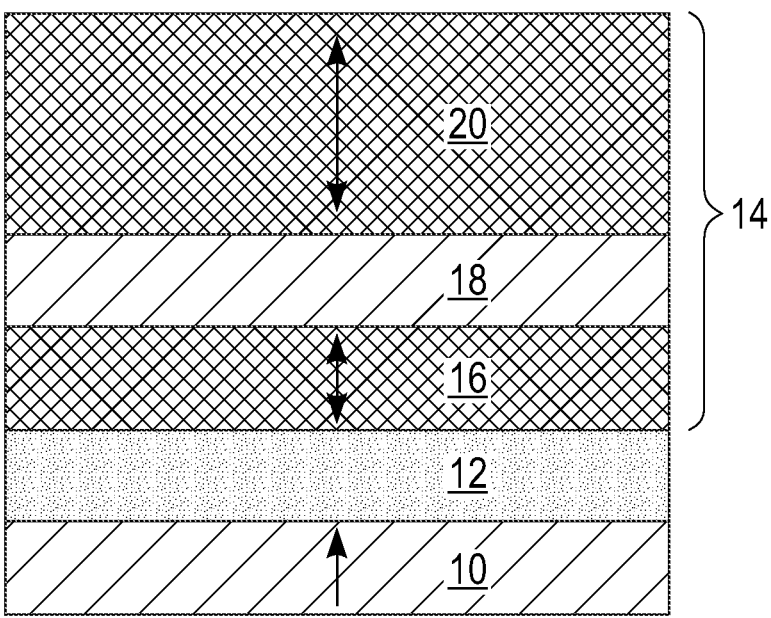
FIG. 2 is a cross sectional view of a prior art MTJ pillar including a multilayered magnetic free layer structure which includes two magnetic free layers separated by a non-magnetic layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 3:
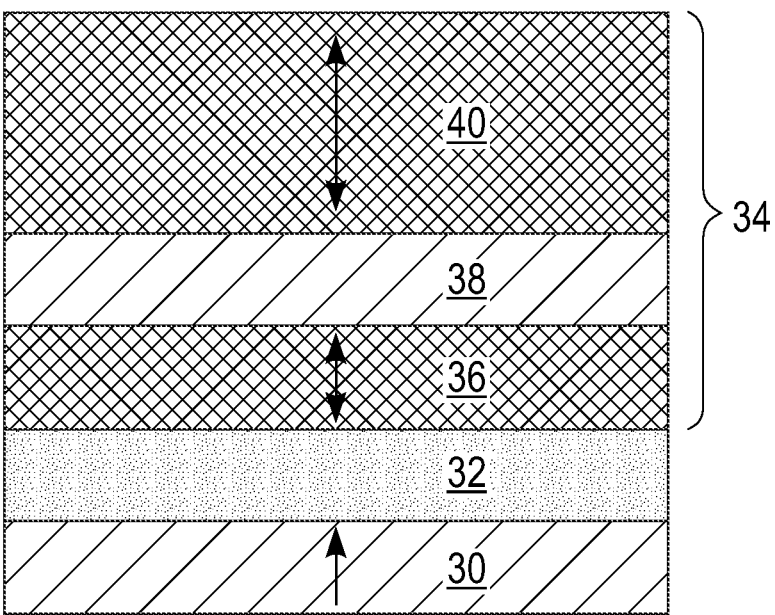
FIG. 3 is a cross sectional view of an exemplary MTJ pillar in accordance with one embodiment of the present application.

Referring first to FIG. 3, there is illustrated an exemplary MTJ pillar in accordance with one embodiment of the present application. The term "pillar" as used in the present application denotes a multilayered structure that has been formed by deposition and photolithography. The MTJ pillar of FIG. 3 includes a magnetic reference layer 30, a tunnel barrier 32, and a multilayered magnetic free layer structure 34 that includes a first magnetic free layer 36, a non-magnetic layer 38, and a second magnetic free layer 40. The MTJ pillar of FIG. 3 is typically present on a conductive landing pad (not shown) that is located on a surface of an electrically conductive structure (not shown) that is embedded in an interconnect dielectric material layer (also not shown). A MTJ cap and a top electrode (both not shown) can be formed on a topmost surface of the second magnetic free layer 40. The MTJ pillar of FIG. 3, together with the MTJ cap and top electrode can be embedded within a second interconnect dielectric material layer.

The magnetic reference layer 30 has a fixed magnetization and it is typically formed upon a conductive landing pad (not shown). The magnetic reference layer 30 may be composed of a metal or metal alloy that includes one or more metals exhibiting high spin polarization. In alternative embodiments, exemplary metals for the formation of magnetic reference layer 30 include iron, nickel, cobalt, chromium, boron, and manganese. Exemplary metal alloys may include the metals exemplified by the above. In another embodiment, the magnetic reference layer 30 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed, and some layers within 30 may be coupled antiparallel to each other in order to reduce the dipole fringing field on the free layer. The thickness of magnetic reference layer 30 will depend on the material selected. In one example, magnetic reference layer 30 may have a thickness from 0.3 nm to 3 nm. The magnetic reference layer 30 can be formed by utilizing a deposition process such as, for example, chemical vapor deposition (CVD), plasma enhanced chemical vapor deposition (PECVD), physical vapor deposition (PVD), or sputtering.

Tunnel barrier layer 32, which is formed above the magnetic reference layer 30, is composed of an insulator material and is formed at such a thickness as to provide an appropriate tunneling resistance. Exemplary materials for the tunnel barrier layer 32 include magnesium oxide, aluminum oxide, and titanium oxide, or their combinations, or materials of higher electrical tunnel conductance, such as semiconductors or low-bandgap insulators. The thickness of the tunnel barrier layer 32 will depend on the material selected. In one example, the tunnel barrier layer 32 may have a thickness from 0.5 nm to 1.5 nm. The tunnel barrier layer 32 can be formed by utilizing a deposition process such as, for example, CVD, PECVD, PVD, or sputtering.

The first magnetic free layer 36 of the multilayered magnetic free layer structure 34 of the present application, which is formed on the tunnel barrier layer 32, is composed of a magnetic material (i.e., a first magnetic material) or a stacked of magnetic materials (i.e., a first magnetic material stack) with a magnetization that can be changed in orientation relative to the magnetization orientation of the magnetic reference layer 30. Exemplary materials for the first magnetic free layer 36 include alloys and/or multilayers of cobalt, iron, alloys of cobalt-iron, nickel, alloys of nickel-iron, and alloys of cobalt-iron-boron. The first magnetic free layer 36 can be formed by utilizing a deposition process such as, for example, CVD, PECVD, PVD, or sputtering.

The first magnetic free layer 36 has a first perpendicular magnetic anisotropy field which is designed to be greater than the second perpendicular magnetic anisotropy field of the second magnetic free layer 40 of the multilayered magnetic free layer structure 34. In one embodiment, the first perpendicular magnetic anisotropy field of the first magnetic free layer 36 is greater than 3000 Oe. In another embodiment, the first perpendicular magnetic anisotropy field of the first magnetic free layer 36 is from 2000 Oe to 10,000 Oe.

The first magnetic free layer 36 has a first thickness. In one embodiment, the first thickness of the first magnetic free layer 36 is from 0.8 nm to 1.5 nm. In the present application, the first thickness is selected to provide the first perpendicular magnetic anisotropy field to the first magnetic free layer 36.

The non-magnetic layer 38 of the multilayered magnetic free layer structure 34 is composed of a non-magnetic material that contains at least one element with an atomic number less than 74 such as, for example, Be, Mg, Al, Ca, B, C, Si, V, Cr, Ti, Mn or any combination including alloys thereof. The thickness of the non-magnetic layer 34 is thin enough to allow the first and second magnetic free layers (36, 40) to couple together magnetically so that in equilibrium layers 36 and 38 are always parallel. In one example, the non-magnetic layer 38 has a thickness from 0.3 nm to 3.0 nm. The non-magnetic layer 38 can be formed by utilizing a deposition process such as, for example, CVD, PECVD, PVD, or sputtering.

The second magnetic free layer 40 of the multilayered magnetic free layer structure 34 is formed on the nonmagnetic material layer 38. The second magnetic free layer 40 may include one of the magnetic materials mentioned above the first magnetic free layer 36. In one embodiment, the second magnetic free layer 40 is composed of a same magnetic material as the first magnetic free layer 26. In another embodiment, the second magnetic free layer 40 is composed of a magnetic material that is compositionally different from the first magnetic free layer. The second magnetic free layer may be formed utilizing one of the deposition processes mentioned above for forming the first magnetic free layer 38.

The second magnetic free layer 40 has a second perpendicular magnetic anisotropy field which is designed to be less than the first perpendicular magnetic anisotropy field of the first magnetic free layer 36 of the multilayered magnetic free layer structure 34. In one embodiment, the second perpendicular magnetic anisotropy field of the second magnetic free layer 40 is less than 2000 Oe. In another embodiment, the second perpendicular magnetic anisotropy field of the second magnetic free layer 40 is from 500 Oe to 3000 Oe.

Applicant observes that the use of such a second magnetic free layer having such a low perpendicular magnetic anisotropy field is not obvious since the goal to achieve fast switching times has been to use a second magnetic free layer having a high perpendicular magnetic anisotropy field. The reason to use a low $H_k$ material for the second magnetic free layer is that this reduces the switching time. In general, in the single domain magnetic model, the switching time, t, is given by:

$$t = \int \frac{d\theta}{\alpha\gamma(H - H_k\cos\theta)}$$

where $\gamma$ is the gyromagnetic constant, H is the magnetic field, and $\theta$ is the polar angle of the magnetic moment. Hence smaller $H_k$ increases the denominator and therefore decreases the switching time.

The second magnetic free layer 40 has a second thickness which is greater than the first thickness of the first magnetic free layer 36. In one embodiment, the second thickness of the second magnetic free layer 40 is from 1.5 nm to 4 nm. In the present application, the second thickness is selected to provide the second perpendicular magnetic anisotropy field to the second magnetic free layer 40.

The multilayered magnetic free layer structure 34 of the present application requires a substantially reduced switching current needed to reorient the magnetization of the magnetic free layers (36, 40). The lower perpendicular magnetic anisotropy field of the second magnetic free layer 40 as compared to the first magnetic free layer 36 improves the switching speed of the magnetic free layers and thus reduces, and even eliminates, write errors.

As mentioned above, and in prior art of spin torque switching, the emphasis has been on using magnetic free layers that have a high perpendicular magnetic anisotropy field (greater than 3000 Oe), in order to allow use of low moment magnetic materials. However, this does not take into account the reliability of switching time correctly. In the present application the reliability of switching can be measured by 'write error rate'. The write error rate is the probability that the bit does not switch when one applies a current pulse. A write error rate of less than 1e-6 is typically needed, though the exact value required varies from application to application in the range 1e-20 to 1e-4. In some prior art free magnetic layers, the write error rate flattens at values greater than 1e-6, so that even at high voltage the magnetic free layer does not write reliably. The above problem is fixed in the present application by utilizing an MTJ pillar that includes the multilayered magnetic free layer structure of the present application and excellent write error rate can be obtained.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of improving the performance of a spin-transfer torque magnetoresistive random access memory, the method comprising:

providing a magnetic tunnel junction (MTJ) pillar comprising a magnetic reference layer, a tunnel barrier layer and a multilayered free layer structure, wherein the multilayered free layer structure comprises a first magnetic free layer having a first thickness, a non-magnetic layer and a second magnetic free layer having a second thickness that is greater than the first thickness, wherein the second magnetic free layer is intentionally designed to have a lower perpendicular magnetic anisotropy field than the first magnetic free layer, and wherein the perpendicular magnetic anisotropy field of the second magnetic free layer is less than 2000 Oe, and the perpendicular magnetic anisotropy field of the first magnetic free layer is greater than 3000 Oe; and applying a voltage signal to the MTJ pillar to reorient magnetization of the first magnetic free layer and the second magnetic free layer, wherein the lower perpendicular magnetic anisotropy field of the second magnetic free layer as compared to the first magnetic free layer reduces switching speed of the multilayered free layer structure relative to a length of the applied voltage to avoid a write error and provides a write error rate of less than $1e^{-6}$ as compared to an equivalent MTJ pillar in which the first magnetic free layer and the second magnetic free layer both have a perpendicular magnetic anisotropy of 3000 Oe or greater.

2. The method of claim 1, wherein the first thickness is from 0.8 nm to 2 nm, and the second thickness is from 1.5 nm to 4 nm.

3. The method of claim 1, wherein the non-magnetic layer is composed of a non-magnetic material that contains at least one element with an atomic number of less than 74.

4. The method of claim 3, wherein the non-magnetic material comprises Be, Mg, Al, Ca, B, C, Si, V, Cr, Ti or Mn.

5. The method of claim 1, wherein the first magnetic free layer and the second magnetic free layer are coupled together magnetically so that in equilibrium the first magnetic free layer and the second magnetic free layer are always parallel.

6. The method of claim 1, wherein the non-magnetic layer is located directly between the first magnetic free layer and the second magnetic free layer, and the first magnetic free layer is in closer proximity to the tunnel barrier than the second magnetic free layer.

7. A spin-transfer torque magnetic random access memory comprising:

a magnetic tunnel junction (MTJ) pillar comprising a magnetic reference layer, a tunnel barrier layer and a multilayered free layered structure, wherein the multilayered free layered structure comprises a first magnetic free layer, a non-magnetic layer and a second magnetic free layer, wherein the second magnetic free layer is intentionally designed to have a lower perpendicular magnetic anisotropy field than the first magnetic free layer such that during application of an applied voltage to the MTJ pillar the first magnetic free layer and the second magnetic free layer exhibit reduced switching speed.

8. The spin-transfer torque magnetic random access memory of claim 7, wherein the perpendicular magnetic anisotropy field of the second magnetic free layer is less than 2000 Oe, and the perpendicular magnetic anisotropy field of the first magnetic free layer is greater than 3000 Oe.

9. The spin-transfer torque magnetic random access memory of claim 7, wherein the perpendicular magnetic anisotropy field of the first magnetic free layer is from 2000 Oe to 10,000 Oe, and the perpendicular magnetic anisotropy field of the second magnetic free layer is from 500 Oe to 3000 Oe.

10. The spin-transfer torque magnetic random access memory of claim 7, wherein the first magnetic free layer has a first thickness, and the second magnetic free layer has a second thickness that is greater than the first thickness.

11. The spin-transfer torque magnetic random access memory of claim 10, wherein the first thickness is from 0.8 nm to 2 nm, and the second thickness is from 1.5 nm to 4 nm.

12. A method of improving the performance of a spin-transfer torque magnetoresistive random access memory, the method comprising:

providing a magnetic tunnel junction (MTJ) pillar comprising a magnetic reference layer, a tunnel barrier layer and a multilayered free layer structure, wherein the multilayered free layer structure comprises a first magnetic free layer having a first thickness, a non-magnetic layer and a second magnetic free layer having a second thickness that is greater than the first thickness, wherein the second magnetic free layer is intentionally designed to have a lower perpendicular magnetic anisotropy field than the first magnetic free layer, and wherein the perpendicular magnetic anisotropy field of the second magnetic free layer is less than 2000 Oe, and the perpendicular magnetic anisotropy field of the first magnetic free layer is greater than 3000 Oe, and wherein the first magnetic free layer is compositionally a same magnetic material as the second magnetic free layer; and applying a voltage signal to the MTJ pillar to reorient magnetization of the first magnetic free layer and the second magnetic free layer, wherein the lower perpendicular magnetic anisotropy field of the second magnetic free layer as compared to the first magnetic free layer reduces switching speed of the multilayered free layer structure relative to a length of the applied voltage to avoid a write error and provides a write error rate of less than $1e^{-6}$ as compared to an equivalent MTJ pillar in which the first magnetic free layer and the second magnetic free layer both have a perpendicular magnetic anisotropy of 3000 Oe or greater.

* * * * *